United States Patent
Kawazoe et al.

(10) Patent No.: US 12,474,216 B2
(45) Date of Patent: Nov. 18, 2025

(54) SENSOR ELEMENT AND METHOD FOR MANUFACTURING SENSOR ELEMENT

(71) Applicant: NICHIA CORPORATION, Anan (JP)

(72) Inventors: Tadashi Kawazoe, Atsugi (JP); Takuya Kadowaki, Yokohama (JP)

(73) Assignee: NICHIA CORPORATION, Anan (JP)

( * ) Notice: Subject to any disclaimer, the term of this patent is extended or adjusted under 35 U.S.C. 154(b) by 434 days.

(21) Appl. No.: 18/185,014

(22) Filed: Mar. 16, 2023

(65) Prior Publication Data
US 2023/0296442 A1   Sep. 21, 2023

(30) Foreign Application Priority Data
Mar. 18, 2022   (JP) ................................. 2022-044346

(51) Int. Cl.
*G01J 5/12*       (2006.01)
*H10F 30/221*   (2025.01)
(Continued)

(52) U.S. Cl.
CPC .............. *G01J 5/12* (2013.01); *H10F 30/221* (2025.01); *H10F 39/107* (2025.01); *H10F 71/121* (2025.01); *H10F 77/1223* (2025.01)

(58) Field of Classification Search
CPC ...... G01J 5/12; H10F 77/1223; H10F 30/221; H10F 39/107; H10F 71/121
See application file for complete search history.

(56) References Cited

U.S. PATENT DOCUMENTS

2009/0120493 A1*   5/2009   Sinha ...................... H10F 77/12
                                                                 136/255
2015/0357361 A1   12/2015   Kajiyama et al.
(Continued)

FOREIGN PATENT DOCUMENTS

JP   2012-186162 A   9/2012
JP   2014-135571 A   7/2014
(Continued)

OTHER PUBLICATIONS

"The Bandgap Wavelength: Where Light Meets Semiconductors" from Renewable Energy Systems (https://www.tidjma.tn/en/electrical/bandgap-wavelength-/) Copyright 2023.*
(Continued)

*Primary Examiner* — Randy W Gibson
(74) *Attorney, Agent, or Firm* — Global IP Counselors, LLP

(57) ABSTRACT

A sensor element includes a first silicon semiconductor portion, a second silicon semiconductor portion, a third silicon semiconductor portion, and a p-n junction. The first silicon semiconductor portion includes a first p-type impurity. The second silicon semiconductor portion is arranged on the first silicon semiconductor portion and includes a second p-type impurity. The third silicon semiconductor portion is arranged on the second silicon semiconductor portion and includes an n-type impurity. The p-n junction is defined between the second silicon semiconductor portion and the third silicon semiconductor portion. The sensor element has light-receiving sensitivity to light having a wavelength longer than a wavelength corresponding to a band gap of silicon.

16 Claims, 9 Drawing Sheets

(51) Int. Cl.
   *H10F 39/10*     (2025.01)
   *H10F 71/00*     (2025.01)
   *H10F 77/1223*   (2025.01)

(56) References Cited

U.S. PATENT DOCUMENTS

2016/0149070 A1   5/2016   Kajiyama et al.
2019/0097384 A1   3/2019   Tsuda
2020/0409186 A1   12/2020  Kadowaki et al.

FOREIGN PATENT DOCUMENTS

| JP | 2015-12047  A | 1/2015 |
| JP | 2018-006496 A | 1/2018 |
| JP | 2019-057692 A | 4/2019 |
| JP | 2021-004909 A | 1/2021 |

OTHER PUBLICATIONS

"Color 1.1 micrometer light" (https://duckduckgo.com/?q=color+1.1+micrometer+light+&t=iphone&ia=images&iax=images&iai=https%3A%2F%2Fwww.livephysics.com%2Fmedia%2Fstories%2Fdata%2Fxemt_spectrum.jpg.pagespeed.ic.RP91TDtO17.jpg) downloaded Jul. 12, 2025.*

* cited by examiner

SENSOR ELEMENT AND METHOD FOR MANUFACTURING SENSOR ELEMENT

CROSS-REFERENCE TO RELATED APPLICATION

This application claims priority to Japanese Patent Application No. 2022-044346, filed on Mar. 18, 2022 the disclosure of which is hereby incorporated herein by reference in its entirety.

BACKGROUND

The present disclosure relates to a sensor element and a method for manufacturing the sensor element.

BACKGROUND ART

In general, a light-receiving element employing silicon cannot detect light at about 1.12 eV or less (about 1.11 μm or more in terms of wavelength) due to restriction by a band gap of silicon. On the other hand, for example, Japanese Patent Publication No. 2015-12047 discloses a light-receiving element having sensitivity to a specific wavelength by applying a forward bias voltage to a semiconductor layer including a p-n junction portion and irradiating the semiconductor layer with light having a wavelength longer than an absorption edge wavelength in the p-n junction portion in order to use the dressed photon.

SUMMARY

The light-receiving element disclosed in Japanese Patent Publication No. 2015-12047 not only has sensitivity to a specific wavelength, but also is expected to emit light.

An object of an embodiment of the present disclosure is to provide a sensor element in which light emission of the element itself is reduced and to provide a manufacturing method of the sensor element.

According to one embodiment of the present disclosure, a first aspect is a sensor element including a first silicon semiconductor portion, a second silicon semiconductor portion, a third silicon semiconductor portion, and a p-n junction. The first silicon semiconductor portion includes a first p-type impurity. The second silicon semiconductor portion is arranged on the first silicon semiconductor portion and includes a second p-type impurity. The third silicon semiconductor portion is arranged on the second silicon semiconductor portion and includes an n-type impurity. The p-n junction is defined between the second silicon semiconductor portion and the third silicon semiconductor portion. The sensor element has light-receiving sensitivity to light having a wavelength longer than a wavelength corresponding to a band gap of silicon. According to another embodiment of the present disclosure, a sensor element includes a first silicon semiconductor portion, a second silicon semiconductor portion, a third silicon semiconductor portion, and a p-n junction. The first silicon semiconductor portion includes a first n-type impurity. The second silicon semiconductor portion is arranged on the first silicon semiconductor portion and includes a second n-type impurity. The third silicon semiconductor portion is arranged on the second silicon semiconductor portion and includes a p-type impurity. The p-n junction is defined between the second silicon semiconductor portion and the third silicon semiconductor portion. An atomic number of the p-type impurity is greater than an atomic number of silicon. The sensor element has light-receiving sensitivity to light having a wavelength longer than a wavelength corresponding to a band gap of silicon According to another embodiment of the present disclosure, a second aspect is a method for manufacturing a sensor element, the method including providing a layered body including a first silicon semiconductor portion including a first p-type impurity, a second silicon semiconductor portion arranged on the first silicon semiconductor portion and including a second p-type impurity, and a third silicon semiconductor portion arranged on the second silicon semiconductor portion and including an n-type impurity, and diffusing the n-type impurity by irradiating the layered body with light having a wavelength longer than a wavelength corresponding to a band gap of silicon while applying a forward current to the layered body.

According to another embodiment of the present disclosure, a method for manufacturing a sensor element includes providing a layered body including a first silicon semiconductor portion including a first n-type impurity, a second silicon semiconductor portion arranged on the first silicon semiconductor portion and including a second n-type impurity, and a third silicon semiconductor portion arranged on the second silicon semiconductor portion and including an p-type impurity, and diffusing the p-type impurity by irradiating the layered body with light having a wavelength longer than a wavelength corresponding to a band gap of silicon while applying a forward current to the layered body.

A sensor element according to certain embodiments of the present disclosure can allow light emission of the element itself to be reduced, and to provide a manufacturing method of the sensor element.

DESCRIPTION OF EMBODIMENTS

The word "step" herein is included in the present terminology if the anticipated purpose of the step is achieved in the case of not only an independent step, but also a step that cannot be clearly distinguished from another step. Furthermore, with respect to an upper limit and a lower limit of numerical ranges described herein, the numerical values exemplified as the numerical range can be freely selected and combined. Embodiments of the present disclosure will be described below in detail. However, the embodiments described below are merely examples of a sensor element and a method for manufacturing the sensor element for embodying the technical concept of the present disclosure, and the invention is not limited to the sensor element and the method for manufacturing the sensor element described below.

Sensor Element 1

Figure 1:
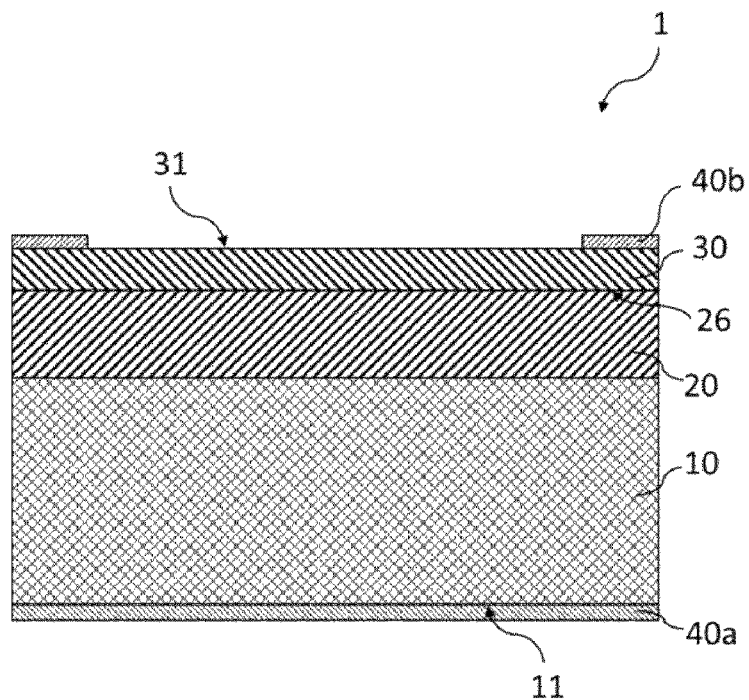
FIG. 1 is a schematic view illustrating a cross-sectional view of a sensor element in an embodiment.

FIG. 1 is a cross-sectional view of a sensor element 1 in an embodiment. The sensor element 1 includes a first silicon semiconductor portion 10 including a first p-type impurity, a second silicon semiconductor portion 20 provided on the first silicon semiconductor portion 10 and including the second p-type impurity, and a third silicon semiconductor portion 30 provided on the second silicon semiconductor portion 20 and including an n-type impurity. The sensor element 1 includes a p-n junction 26 located between the second silicon semiconductor portion 20 and the third silicon semiconductor portion 30 and has light-receiving sensitivity to light having a wavelength longer than a wavelength corresponding to a band gap of silicon.

In a case in which a dressed photon is used to make a sensor element sensitive to light having a wavelength longer than a wavelength corresponding to a band gap of silicon, the sensor element will have light-receiving sensitivity, and at the same time light emission efficiency of the sensor element will be improved. However, if the sensor element itself emits light, the light is received by the sensor element while using as a sensor. The light emission of the sensor element itself can be noise for the sensor element, but a discussion has not been made so far from such a point of view. That is, a new problem of reducing the light emission of the sensor element itself is solved by the above-described configuration. In the sensor element 1 of the embodiment, the first silicon semiconductor portion 10 and the second silicon semiconductor portion 20 include the p-type impurity, and the third silicon semiconductor portion 30 includes the n-type impurity, so that the light emission of the sensor element 1 itself can be reduced.

First Silicon Semiconductor Portion 10

The first silicon semiconductor portion 10 is, for example, a silicon substrate including the first p-type impurity or a silicon semiconductor layer including the first p-type impurity. The first silicon semiconductor portion 10 is preferably a silicon substrate including the first p-type impurity. Examples of the first p-type impurity include boron, aluminum, gallium, and indium. The first silicon semiconductor portion includes the first p-type impurity at a first concentration. The first concentration is, for example, in a range from $1\times10^{17}$ cm$^{-3}$ to $1\times10^{21}$ cm$^{-3}$, preferably in a range from $1\times10^{18}$ cm$^{-3}$ to $1\times10^{20}$ cm$^{-3}$. The concentration of impurities included in silicon can be estimated by secondary ion mass spectroscopy (SIMS). The electrical resistivity of the first silicon semiconductor portion 10 is, for example, in a range from 0.001 Ωcm to 1 Ωcm, preferably in a range from 0.01 Ωcm to 1 Ωcm. The relationship between the impurity concentration and the electrical resistivity of the first silicon semiconductor portion 10 can be predicted by referring to, for example, an Irvin curve. The same applies to the second silicon semiconductor portion 20 and the third silicon semiconductor portion 30 to be described below. A thickness of the first silicon semiconductor portion 10 may be, for example, in a range from 100 μm to 800 μm. The first silicon semiconductor portion 10 may be monocrystalline silicon, polycrystalline silicon, or amorphous silicon and is preferably monocrystalline silicon. A silicon semiconductor layer formed by epitaxial growth can be selected as the second silicon semiconductor portion 20.

Second Silicon Semiconductor Portion 20

The second silicon semiconductor portion 20 is, for example, a silicon substrate including the second p-type impurity or a silicon semiconductor layer including the second p-type impurity. The second silicon semiconductor portion 20 is preferably a silicon semiconductor layer including the second p-type impurity. In the silicon semiconductor layer, for example, it is desirable that crystal orientations are aligned in at least one direction. For example, the silicon semiconductor layer may be epitaxially grown. Examples of the second p-type impurity include boron, aluminum, gallium, and indium. The second p-type impurity is preferably boron or aluminum, particularly preferably aluminum. Compared with the atomic numbers of gallium and indium, the atomic numbers of boron and aluminum are close to the atomic number of silicon. In this manner, as the atomic number of the impurity is closer to the atomic number of silicon, phonon confinement is less likely to occur. Thus, it is possible to reduce light emission via the dressed photon and the dressed photon phonon. Because the diffusion of the impurities is suppressed, the light emission efficiency of the sensor element 1 further decreases. Because the sensor element 1 hardly receives light emitted by the sensor element 1, the noise of the sensor element 1 is reduced. Because the noise is reduced, the sensor element 1 can stably operate in a wide temperature range. The second silicon semiconductor portion 20 includes the second p-type impurity at a second concentration. The second concentration is lower than the first concentration. Because the electrical resistivity of the second silicon semiconductor portion 20 can be made higher than the electrical resistivity of the first silicon semiconductor portion 10, a voltage applied to a portion where the p-n junction 26 is provided increases. Accordingly, because a current value flowing through the element is increased, it is possible to provide a sensor having high sensitivity. The second concentration is, for example, in a range from $1\times10^{14}$ cm$^{-3}$ to $1\times10^{16}$ cm$^{-3}$, preferably in a range from $5\times10^{14}$ cm$^{-3}$ to $1\times10^{16}$ cm$^{-3}$. The electrical resistivity of the second silicon semiconductor portion 20 is greater than the electrical resistivity of the first silicon semiconductor portion 10 and is, for example, in a range from 0.1 Ωcm to 100 Ωcm, preferably in a range from 1 Ωcm to 10 Ωcm. A thickness of the second silicon semiconductor portion 20 is, for example, in a range from 2 μm to 10 μm.

Third Silicon Semiconductor Portion 30

The third silicon semiconductor portion 30 is, for example, a silicon semiconductor layer including the n-type impurity. Because the mobility of the holes is less than the mobility of the electrons, the hole distribution of the second silicon semiconductor portion 20 spreads toward the third silicon semiconductor portion 30. However, because the mobility of the holes is less than the mobility of the electrons, the spread of the holes is less than the spread of the electrons. Thus, the probability of occurrence of radiative recombination in the sensor element 1 can be reduced. That is, the light emission of the sensor element 1 itself can be reduced. The n-type impurity may be, for example, nitrogen, phosphorus, arsenic, antimony, or bismuth. The n-type impurity preferably has an atomic number greater than that of silicon. Because the atomic number of the n-type impurity is greater than the atomic number of silicon, diffusion is less likely to occur. These atoms can make it difficult to obtain light emission via the dressed photon and the dressed photon phonon while improving light-receiving sensitivity. For example, the n-type impurity is preferably phosphorus, arsenic, antimony, or bismuth, more preferably arsenic, antimony, or bismuth. The third silicon semiconductor portion 30 includes the n-type impurity at a third concentration. The third concentration is, for example, in a range from $1 \times 10^{18}$ cm$^{-3}$ to $1 \times 10^{20}$ cm$^{-3}$, preferably in a range from $5 \times 10^{18}$ cm$^{-3}$ to $5 \times 10^{19}$ cm$^{-3}$. The third concentration may not be constant in the entire third silicon semiconductor portion 30, and for example, the third concentration may change from the third silicon semiconductor portion 30 toward the first silicon semiconductor portion 10. The electrical resistivity of the third silicon semiconductor portion 30 may be, for example, in a range from 0.1 Ωcm to 100 Ωcm, preferably in a range from 1 Ωcm to 10 Ωcm. The thickness of the third silicon semiconductor portion 30 may be, for example, in a range from 1 μm to 2 μm.

p-n Junction 26

The p-n junction 26 is formed between the second silicon semiconductor portion 20 and the third silicon semiconductor portion 30. In a portion where the p-n junction 26 is formed, a part of the n-type impurity may have a predetermined distribution. The n-type impurity may have a distribution that satisfies, for example, (band gap of silicon)−(phonon energy in silicon)×(interval of n-type impurities)×(integer)=(energy corresponding to wavelength that can be received). Such a distribution can be analyzed by, for example, three dimensional atom probe spectroscopy.

Positive Electrode 40a

A positive electrode 40a is electrically connected to the first silicon semiconductor portion 10. The positive electrode 40a is provided, for example, on an entire first main surface 11 of the first silicon semiconductor portion 10. The material of the positive electrode 40a may be, for example, formed from at least one metal selected from the group consisting of chromium, platinum, and gold.

Negative Electrode 40b

Figure 2:
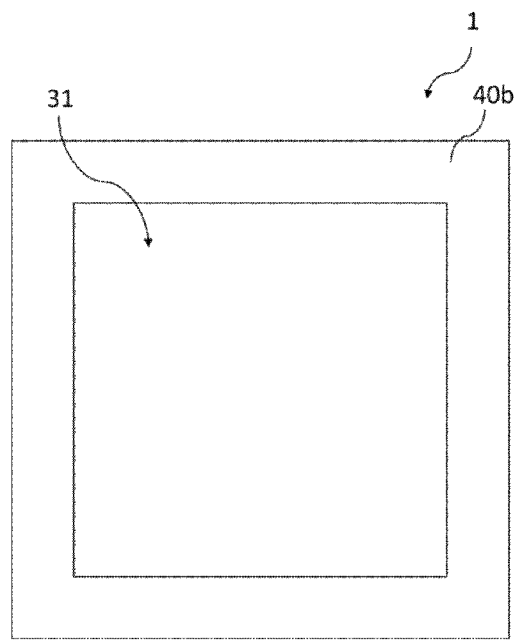
FIG. 2 is a schematic view illustrating a top view of the sensor element in the embodiment.

A negative electrode 40b is electrically connected to the third silicon semiconductor portion 30. The negative electrode 40b is provided on, for example, a second main surface 31 of the third silicon semiconductor portion 30. As illustrated in FIG. 2, the negative electrode 40b may be provided as an annular shape along an edge of the second main surface 31. Thereby, it is possible to efficiently receive light on the second main surface 31 while causing a forward current to flow through the element. The negative electrode 40b may be in a range from 0.01 times to 0.5 times as wide as one side of the second main surface 31. The material of the negative electrode 40b may be, for example, formed from at least one metal selected from the group consisting of titanium, platinum, and gold.

Light-Receiving Wavelength of Sensor Element 1

The sensor element 1 in the embodiment is driven by applying a forward current and has light-receiving sensitivity to light having a wavelength longer than a wavelength corresponding to the band gap of silicon. For example, the sensor element 1 in the embodiment has light-receiving sensitivity at a wavelength in a range from 1110 nm to 4000 nm, preferably from 1200 nm to 1500 nm. Such a range of the light-receiving wavelength is considered to be caused by diffusion of the n-type impurity to form a predetermined distribution. The light-receiving sensitivity at a wavelength longer than the wavelength corresponding to the band gap of silicon can be given to the sensor element 1 by, for example, a step of diffusing the n-type impurity described below. A known sensor element made of silicon is driven by being applied a reverse current and can receive only light having a wavelength shorter than a wavelength corresponding to the band gap of silicon. In the embodiment, the p-n junction 26 does not include materials other than silicon, the n-type impurity, and the p-type impurity. Thus, the light-receiving wavelength of the sensor element 1 does not result from a material having a smaller band gap than silicon, such as InGaAs. Furthermore, the light-receiving element made of a material such as InGaAs needs to be cooled in order to be driven, but the sensor element 1 of the embodiment can be driven without being cooled.

Current-Voltage Characteristics

Figure 3:
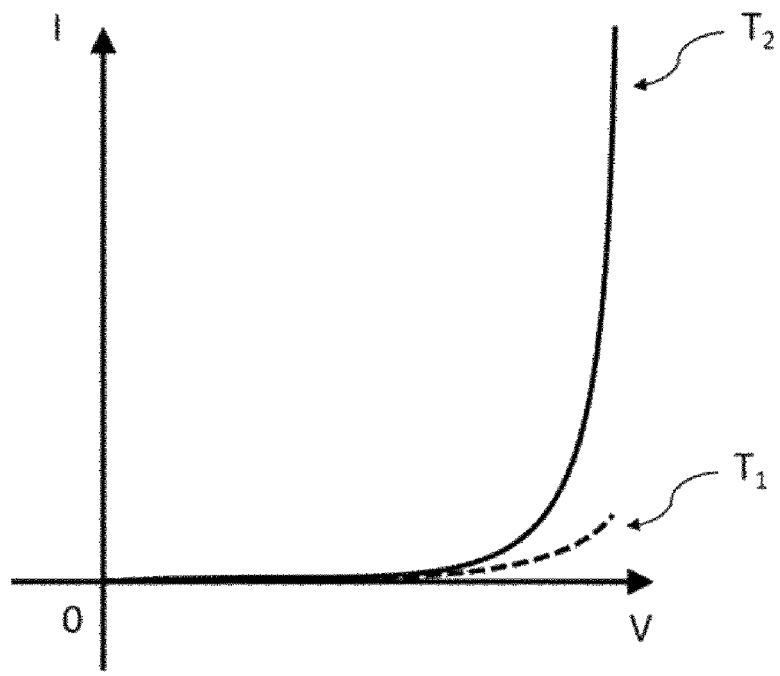
FIG. 3 is a schematic view illustrating current-voltage characteristics of the sensor element in the embodiment.

Here, current-voltage characteristics of the sensor element 1 in the embodiment will be described. The sensor element 1 in the embodiment exhibits an S-type negative resistance, and a part of current-voltage characteristics of the sensor element 1 can be approximated by a quadratic expression $I = a(t) + b(t)V + c(t)V^2$ ... (1) of a voltage. Here, a(t), b(t), and c(t) are each temperature dependent coefficients. FIG. 3 is a formula diagram illustrating a part of the current-voltage characteristics represented by the formula (1). The broken line represents the current-voltage characteristics when the temperature is $T_1$, and the solid line represents the current-voltage characteristics when the temperature is $T_2$. $T_1$ and $T_2$ have a relationship of $T_1 < T_2$.

In the sensor element 1 in the embodiment, not only the coefficient of the 0-th order term of the voltage but also the coefficients of the first order term and the second order term of the voltage exhibit temperature dependence as illustrated in the formula (1). As illustrated in FIG. 3, the current-voltage characteristics vary steeply and nonlinearly as the voltage increases. Thus, in the sensor element 1 in the embodiment, because the coefficients of the first order term and the second order term of the voltage exhibit temperature dependence, it is possible to increase the value of the current flowing through the sensor element 1 at a predetermined voltage value. Such current-voltage characteristics of the sensor element 1 are considered to be due to the fact that the sensor element 1 can receive light having a wavelength longer than a wavelength corresponding to the band gap of silicon. That is, such characteristics are considered to be due to the fact that the electric resistance in the p-n junction 26 includes a component depending on the Steinhart-Hart equation indicating the temperature characteristics of the thermistor and a component depending on the Stefan-Boltzmann law indicating the temperature characteristics by the black body radiation.

Amount of Change in Voltage Value Per Degree in 10 mA Current Value

The sensor element 1 according to the embodiment exhibits a great temperature dependence in the current-voltage characteristics of the sensor element 1. Thus, the amount of change in the voltage value per degree at a predetermined current value of the sensor element 1 in the embodiment is large. In this description, the amount of change in the voltage value per degree in the current value of 10 mA is referred to as a voltage gradient. The voltage gradient may be, for example, in a range from 150 mV/° C. to 300 mV/° C. at a temperature in a range from 20° C. to 45° C. The voltage gradient may be, for example, in a range from 160 mV/° C. to 290 mV/° C. or from 170 mV/° C. to 280 mV/° C. at a temperature in a range from 20° C. to 45° C. Because the sensor element 1 in the embodiment includes the first silicon semiconductor portion 10, the second silicon semiconductor portion 20, and the third silicon semiconductor portion 30 described above, the light emission efficiency of the sensor element 1 decreases. Thus, noise generated when the sensor element 1 receives light emitted by the sensor element 1 itself is suppressed, and a temperature range in which the sensor element 1 can be stably used is expanded. That is, the sensor element 1 operates stably. For example, the voltage gradient of a known sensor element made of a silicon semiconductor that cannot receive light of a wavelength longer than a wavelength corresponding to the band gap of silicon is about 2 mV/° C. Compared to this, the voltage gradient of the sensor element 1 in the embodiment is steep. This means that the sensor element 1 has high sensitivity.

Electrical Resistivity

An electrical resistivity of a portion made of the first silicon semiconductor portion 10, the second silicon semiconductor portion 20, and the third silicon semiconductor portion 30 is, for example, in a range from 1 Ωcm to 1000 MΩcm, preferably from 100 Ωcm to 100 MΩcm at a temperature of 25° C. and an applied voltage in a range from 1 V to 100 V. Alternatively, the electrical resistivity of the portion made of the first silicon semiconductor portion 10, the second silicon semiconductor portion 20, and the third silicon semiconductor portion 30 is, for example, in a range from 1 kΩcm to 100 MΩcm, preferably from 10 MΩcm to 100 MΩcm at a temperature of 25° C. and an applied voltage in a range from 10 V to 30 V. Because the electrical resistivity of the sensor element 1 is relatively high, it is easy to apply a high voltage to the sensor element 1. As the applied voltage is higher, the contribution of the first order term and the second order term of the voltage in the formula (1) can be increased, and thus the sensitivity of the sensor element 1 can be increased. Furthermore, the first silicon semiconductor portion includes the first p-type impurity at the first concentration, the second silicon semiconductor portion 20 includes the second p-type impurity at the second concentration, and the second concentration is lower than the first concentration. Thus, in the sensor element 1, the electrical resistivity of the second silicon semiconductor portion 20 is greater than the electrical resistivity of the first silicon semiconductor portion 10. As a result, a higher voltage can be applied to the portion where the p-n junction 26 is formed, so that the sensitivity of the sensor element 1 can be increased.

Negative Resistance

Figure 4:
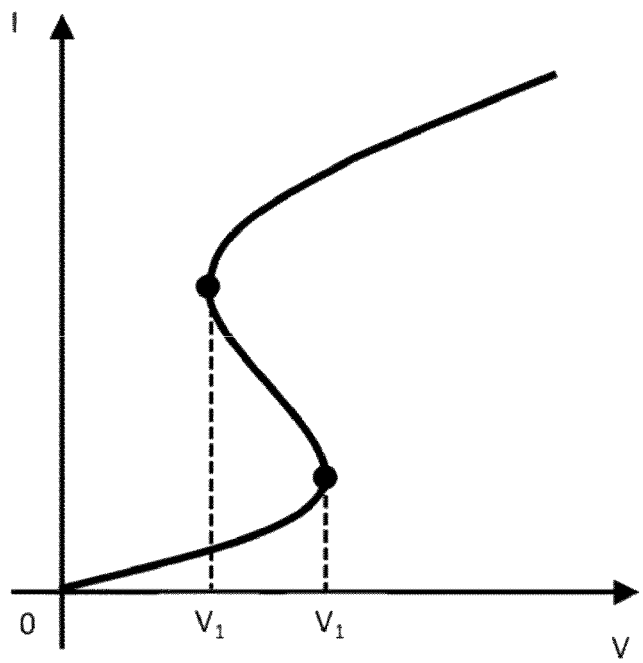
FIG. 4 is a schematic view illustrating current-voltage characteristics of an element exhibiting an S-type negative resistance.

The sensor element 1 in the embodiment exhibits an S-type negative resistance. FIG. 4 is a schematic view illustrating current-voltage characteristics in the S-type negative resistance. It can be seen that there are two kinds of current values between certain voltage values $V_1$ and $V_2$. When two current values are used, it is difficult to measure an accurate voltage gradient. Thus, it is preferable to drive the sensor element 1 in a voltage range less than the voltage value $V_1$. Note that the voltage value $V_1$ is a lower one of voltage values indicating turning points of the voltage value in the current-voltage characteristics. Note that the voltage value $V_2$ is a higher one of voltage values indicating turning points of the voltage value in the current-voltage characteristics.

As described above, the sensor element 1 of the embodiment can reduce light emission by the sensor element 1 itself. Furthermore, the sensor element 1 of the embodiment operates more stably in a wide temperature range. In addition, the sensor element 1 of the embodiment has greater sensitivity than a semiconductor sensor element that cannot receive light having a wavelength longer than a wavelength corresponding to the band gap of silicon. In particular, the sensor element 1 of the embodiment has a steep voltage gradient and great sensitivity to temperature changes.

The sensor element 1 in the embodiment has been described above, but the sensor element 1 is not limited thereto. The sensor element 1 according to the embodiment may include the first silicon semiconductor portion including the first n-type impurity, the second silicon semiconductor portion provided on the first silicon semiconductor portion and including the second n-type impurity, and the third silicon semiconductor portion provided on the second silicon semiconductor portion and including the p-type impurity. The sensor element 1 may include the p-n junction located between the second silicon semiconductor portion and the third silicon semiconductor portion. An atomic number of the p-type impurity may be greater than an atomic number of silicon. The sensor element 1 may have the light-receiving sensitivity to light having a wavelength longer than a wavelength corresponding to the band gap of silicon. Because the atomic number of the p-type impurity is greater than the atomic number of silicon, the p-type impurity is heavier than silicon and is less likely to diffuse. The p-type impurity can make it difficult to obtain light emission via the dressed photon and the dressed photon phonon while improving light-receiving sensitivity. Examples of the p-type impurity include gallium and indium. Because the atomic number of gallium or indium is greater than that of silicon, gallium or indium is heavier than silicon and is less likely to diffuse. In addition, the configuration same as or similar to the above-described configuration can be provided except that the n-type impurity and the p-type impurity are replaced with each other.

Method for Manufacturing Sensor Element 1

Figure 5A:
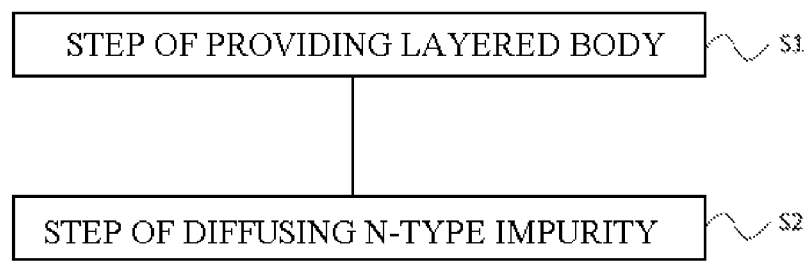
FIG. 5A is a flowchart illustrating a method for manufacturing the sensor element in the embodiment.
Figure 5B:
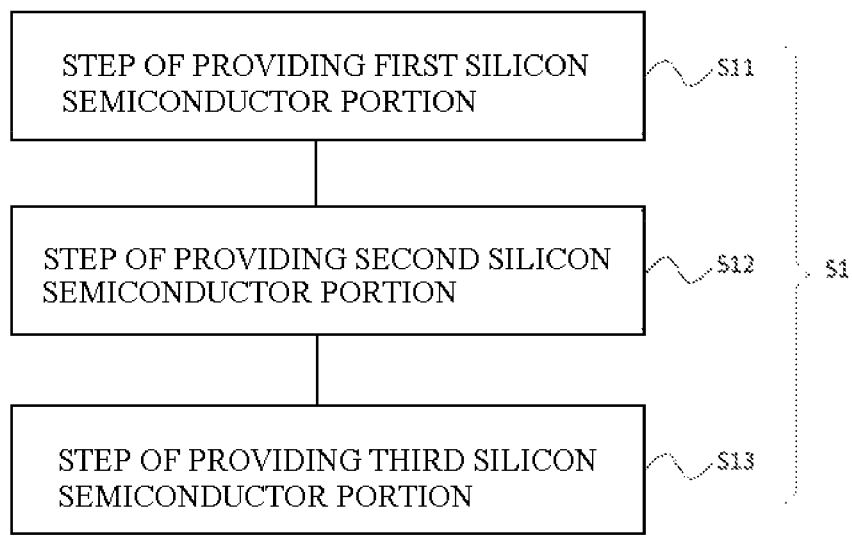
FIG. 5B is a flowchart illustrating an example of a step of providing a layered body in the embodiment.

Hereinafter, a method for manufacturing a sensor element 1 in the embodiment will be described with reference to FIGS. 5A, 5B, and 6 to 12. As illustrated in FIGS. 5A and 5B, the method for manufacturing the sensor element 1 in the embodiment includes providing a layered body 1A including a first silicon semiconductor portion 10 including a first p-type impurity, a second silicon semiconductor portion 20 provided on the first silicon semiconductor portion 10 and including a second p-type impurity, and a third silicon semiconductor portion 30 provided on the second silicon semiconductor portion 20 and including an n-type impurity, and diffusing the n-type impurity by irradiating the layered body 1A with light having a wavelength longer than a wavelength corresponding to a band gap of silicon while applying a forward current to the layered body 1A.

Because the first silicon semiconductor portion 10 and the second silicon semiconductor portion 20 include the p-type impurity and the third silicon semiconductor portion 30 includes the n-type impurity, it is possible to manufacture a sensor element in which light emission of the sensor element itself is reduced. As a result, noise due to self-emission is reduced, and the sensor element 1 that operates stably can be manufactured.

As illustrated in FIG. 5A, the method for manufacturing the sensor element 1 includes a step of providing the layered body and a step of diffusing the n-type impurity. As illustrated in FIG. 5B, the step of providing the layered body may include a step of providing the first silicon semiconductor portion 10, a step of providing the second silicon semiconductor portion 20, and a step of providing the third silicon semiconductor portion 30.

Step of Providing First Silicon Semiconductor Portion 10

Figure 6:
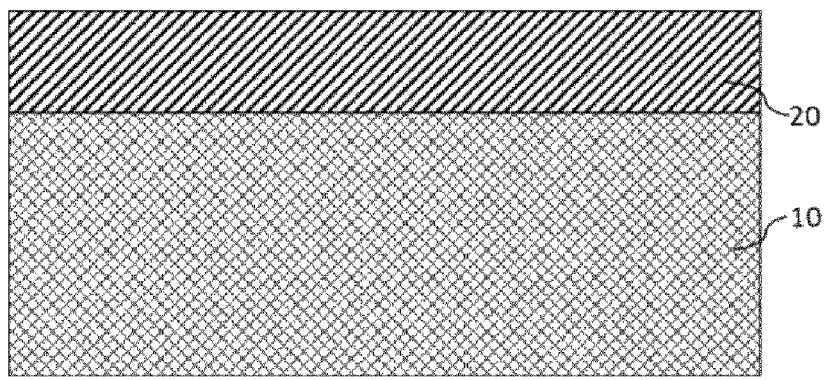
FIG. 6 is a schematic view illustrating a step of providing a first silicon semiconductor portion and a step of providing a second silicon semiconductor portion.

As illustrated in FIG. 6, the step of providing the first silicon semiconductor portion 10 is a step of providing a silicon substrate including the first p-type impurity or a silicon semiconductor layer including the first p-type impurity. The first silicon semiconductor portion 10 is preferably the silicon substrate including the first p-type impurity. When the first silicon semiconductor portion 10 is the silicon substrate, a silicon wafer taken out from an ingot manufactured by a pulling method (also referred to as a Czochralski method) or a floating zone melting method may be used. The first p-type impurity included in the first silicon semiconductor portion 10 may be, for example, boron, aluminum, gallium, or indium.

Step of Providing Second Silicon Semiconductor Portion 20

As illustrated in FIG. 6, the step of providing the second silicon semiconductor portion 20 is a step of providing a silicon substrate including the second p-type impurity or a silicon semiconductor layer including the second p-type impurity on the first silicon semiconductor portion 10. The second silicon semiconductor portion 20 is preferably the silicon semiconductor layer including the second p-type impurity. The impurity concentration (second concentration) of the second p-type impurity included in the second silicon semiconductor portion 20 is higher than the impurity concentration (first concentration) of the first p-type impurity included in the first silicon semiconductor portion 10. Such a magnitude correlation of the concentration can be easily formed when the second silicon semiconductor portion 20 is a silicon semiconductor layer. The second p-type impurity included in the second silicon semiconductor portion 20 may be, for example, boron, aluminum, gallium, or indium. In order to reduce the light emission efficiency of the sensor element 1, the second p-type impurity is preferably boron or aluminum, and the second p-type impurity is more preferably aluminum. When the second silicon semiconductor portion 20 is a silicon semiconductor layer, it may be formed by, for example, a chemical vapor deposition (CVD) method, a molecular beam epitaxy (MBE) method, a plasma CVD method, or the like. The crystal orientation of the second silicon semiconductor portion 20 is preferably aligned in at least one direction. For example, the second silicon semiconductor portion may be epitaxially grown on the first silicon semiconductor portion 10. Thus, it is preferable to use, for example, the CVD method or the MBE method, and the CVD method, which is simpler to manufacture, is more preferable. The CVD method is a method for performing thermal decomposition or hydrogen reduction on a compound gas such as monosilane ($SiH_4$) or silicon tetrachloride ($SiCl_4$). The second p-type impurity can be formed by, for example, mixing an impurity compound gas such as phosphine ($PH_3$) or arsine ($AsH_3$) with the supplied gas. The second silicon semiconductor portion 20 may be, for example, a silicon semiconductor layer epitaxially grown on a (100) plane, a (110) plane, or a (111) plane of the silicon substrate that is the first silicon semiconductor portion 10. The second p-type impurity may be, for example, boron or aluminum.

Step of Providing Third Silicon Semiconductor Portion 30

Figure 7:
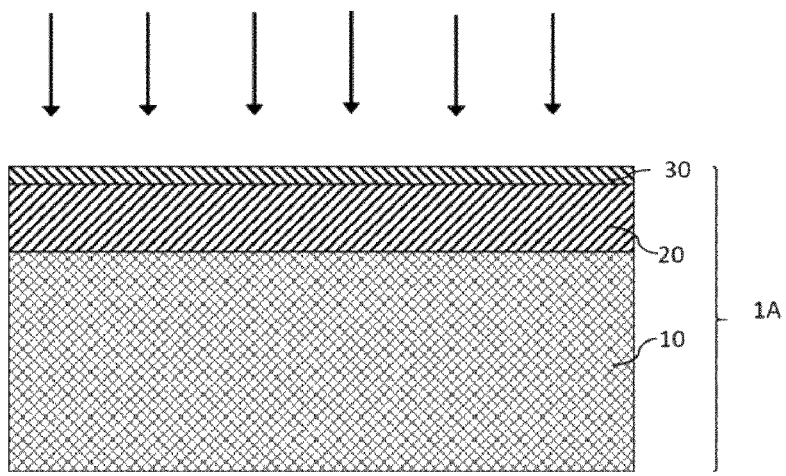
FIG. 7 is a schematic view illustrating a step of providing a third silicon semiconductor portion.
Figure 8:
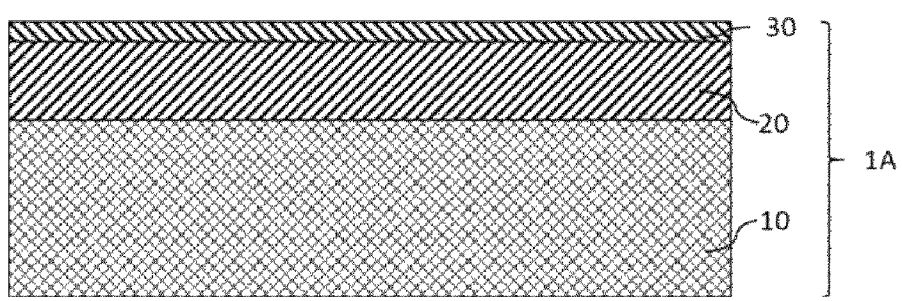
FIG. 8 is a schematic view illustrating a step of thinning the first silicon semiconductor portion.

As illustrated in FIG. 7, the step of providing the third silicon semiconductor portion 30 is a step of providing the third silicon semiconductor portion 30 on the second silicon semiconductor portion 20 by performing ion implantation on the second silicon semiconductor portion 20. The arrows in FIG. 7 indicate how ions are implanted. In this step, the atoms to be ion-implanted are atoms serving as n-type impurities, and may be, for example, phosphorus, arsenic, antimony, or bismuth. The n-type impurity preferably has an atomic number greater than that of silicon. By making the atomic number of the n-type impurity greater than the atomic number of silicon, diffusion of the n-type impurity can be made difficult to occur. These atoms can make it difficult to obtain light emission via the dressed photon and the dressed photon phonon while improving light-receiving sensitivity. The n-type impurity is preferably phosphorus, arsenic, antimony, or bismuth, more preferably arsenic, antimony, or bismuth. In the ion implantation, for example, impurity ions accelerated with an energy in a range from 10 keV to 1000 keV are implanted into the second silicon semiconductor portion 20. The energy for accelerating the impurities may be one kind or two or more kinds. Alternatively, the ion implantation may be performed while changing the energy. The implantation dose may be, for example, in a range from $1 \times 10^{12}$ atoms/cm$^2$ to $1 \times 10^{15}$ atoms/cm$^2$. After the ion implantation, the first silicon semiconductor portion 10 may be thinned as illustrated in FIG. 8. In the step of diffusing the n-type impurity described below, the layered body 1A is efficiently cooled, and the n-type impurity is easily diffused so as to have a desired distribution. The first silicon semiconductor portion 10 may be thinned by, for example, chemical mechanical polishing.

Step of Forming First Electrode 50a and Second Electrode 50b

Figure 9:
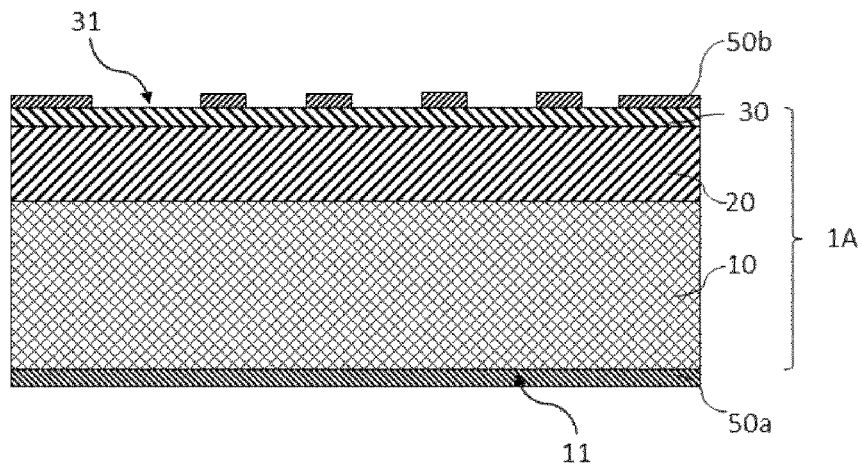
FIG. 9 is a schematic view illustrating a step of forming a first electrode and a second electrode.

After the layered body 1A is formed, a first electrode 50a and a second electrode 50b are formed. FIG. 9 illustrates a step of forming the first electrode 50a and the second electrode 50b. The first electrode 50a is electrically connected to the first silicon semiconductor portion 10. The first electrode 50a is provided on the entire first main surface 11 of the first silicon semiconductor portion 10 by, for example, a sputtering method. The second electrode 50b is electrically connected to the third silicon semiconductor portion 30. The second electrode 50b is provided on, for example, the second main surface 31 of the third silicon semiconductor portion 30. The second electrode 50b may be formed in a lattice shape. Thereby, in the step of performing DPP anneal described below, it is possible to efficiently inject a forward current into the layered body 1A and to provide carriers for performing stimulated emission.

Step of Diffusing n-Type Impurity

Figure 10:
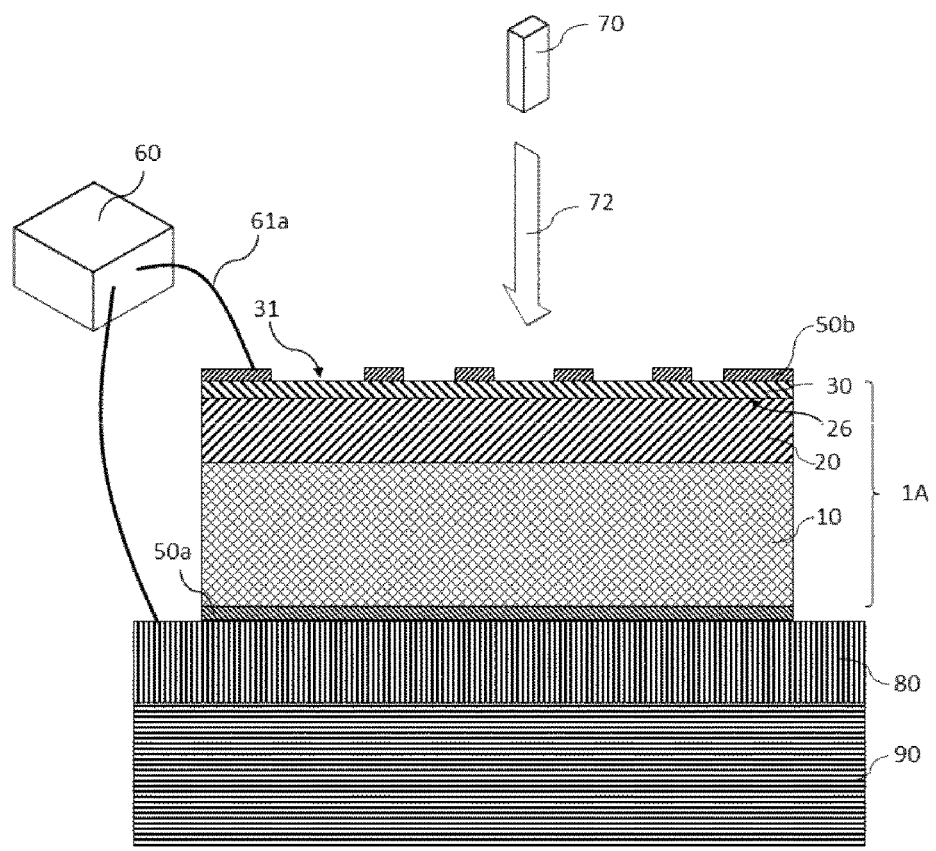
FIG. 10 is a schematic view illustrating a step of diffusing an n-type impurity.
Figure 11:
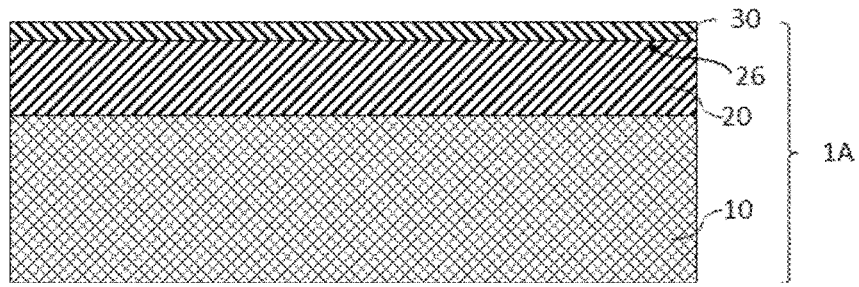
FIG. 11 is a schematic view illustrating a step of removing the first electrode and the second electrode.

FIG. 10 is a schematic view illustrating a step of diffusing the n-type impurity. In this step, the layered body 1A is irradiated with light having a predetermined wavelength while a forward current is caused to flow from a power supply 60 to the layered body 1A through the first electrode 50a and the second electrode 50b each connected by a wire 61a. An open arrow 72 in FIG. 10 represents light having a predetermined wavelength. The light having the predetermined wavelength is light having a wavelength longer than a wavelength corresponding to the band gap of silicon. By this step, the p-n junction 26 is formed, and the layered body 1A can have the light-receiving sensitivity to the wavelength corresponding to the wavelength of the irradiated light. This is considered to be because the diffusion of the n-type impurity is controlled by the irradiation light. This is explained as follows, based on an assumption that the dressed photon, which is a kind of near-field light, and the dressed photon phonon resulting from an interaction between the dressed photon and a phonon of silicon are generated in the vicinity of the n-type impurity. The impurities diffused by the current injection receive the irradiated light to cause stimulated emission. Because this stimulated emission utilizes part of Joule heat generated by current injection, this means that part of the energy is discharged from the element. That is, the element is cooled in a portion where stimulated emission occurs, and the progress of annealing is reduced. This is referred to as dressed photon phonon assisted anneal (DPP anneal). Some of the n-type impurities after the DPP anneal are considered to distribute in a self-organizing manner at intervals corresponding to the energy of the irradiated light. For example, the n-type impurity distributed in a self-organizing manner may have a periodic structure satisfying, for example, (band gap of silicon)−(phonon energy in silicon)×(interval of n-type impurities)×(integer)=(energy corresponding to wavelength that can be received). The sensor element 1 is considered to have light-receiving sensitivity at a wavelength longer than a wavelength corresponding to the band gap of silicon due to such a distribution of the n-type impurity. The wavelength of the light irradiated in the DPP anneal is, for example, in a range from 1110 nm to 4000 nm. The light to be irradiated may be laser beam irradiated from the light source 70. The light to be irradiated may be irradiated in a direction toward the second major surface 31 that is a surface of the layered body 1A in which the third silicon semiconductor portion is present. The light to be irradiated may be irradiated to a part of the second main surface 31 or may be irradiated to a plurality of portions of the second main surface 31 by scanning the light source 70. Because the probability of the stimulated emission and the probability of the spontaneous emission are substantially the same, when the stimulated emission occurs in the layered body 1A, the spontaneous emission also occurs to the same extent. Thus, the stimulated emission occurs even in the vicinity of the n-type impurity in a region not irradiated with the light by the spontaneously emitted light propagating through the layered body 1A, and the diffusion of the n-type impurity can be controlled. The current density of the forward current to be injected may be, for example, in a range from 1 A/cm² to 100 A/cm². The forward current may be, for example, a steady current, a triangular wave current, or a pulse current. In the case of the triangular wave current, a cycle time can be, for example, in a range from 0.5 seconds to 10 seconds. In the case of the pulse current, the cycle time is, for example, in a range from 1 millisecond to 10 milliseconds, and the duty ratio of the energization time to the cycle time can be in a range from 80% to 98%. In the step of diffusing the n-type impurity, as illustrated in FIG. 10, the layered body 1A may be disposed on a Peltier element 80 provided on a heat sink 90. The temperature of the element can be adjusted by the Peltier element 80. The heat sink 90 may be made of alumina or aluminum nitride, for example. In the step of diffusing the n-type impurity, the first electrode 50a and the second electrode 50b used for injecting the forward current into the layered body 1A may be used as the positive electrode 40a and the negative electrode 40b, respectively, of the sensor element 1 in the embodiment. In the case in which an electrode different from the first electrode 50a and the second electrode 50b is to be provided for the sensor element 1, the first electrode 50a and the second electrode 50b are removed by etching after the step of diffusing the n-type impurity as illustrated in FIG. 11.

Singulation Step

Figure 12:
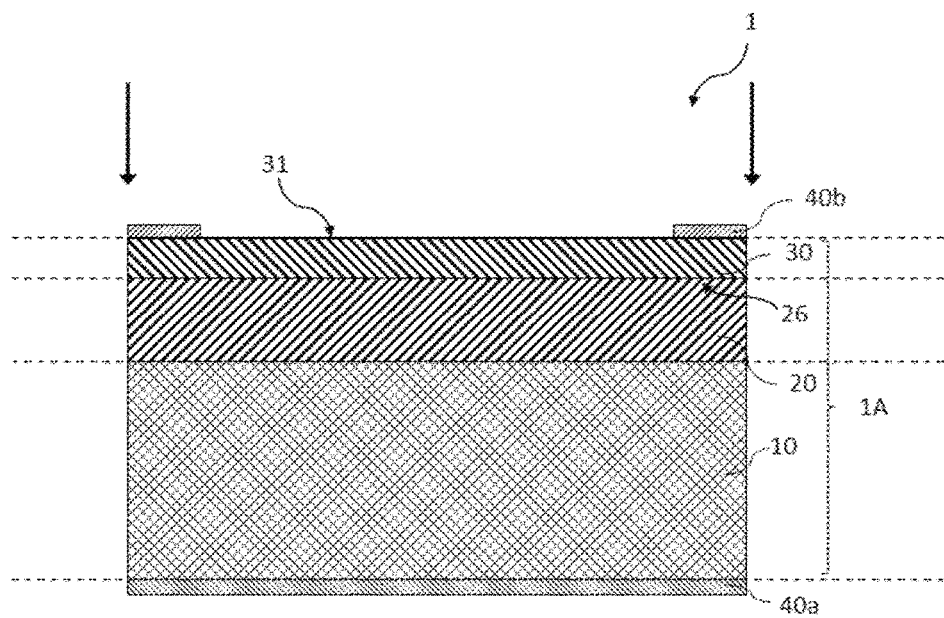
FIG. 12 is a schematic view illustrating a singulation step.

After the step of diffusing the n-type impurity, the layered body 1A may be singulated. FIG. 12 illustrates a singulation step. For example, singulation may be performed so that one side is in a range from 1 µm to 10000 µm. An arrow illustrated in FIG. 12 indicates a singulation position. A broken line indicates other sensor elements 1 to be singulated. The singulation can be performed by, for example, laser scribing, dicing, or the like. In the singulation step, for example, the sensor elements 1 may be singulated so as to form cells in an n×n matrix. At this time, in each cell, the third silicon semiconductor portion 30 and the second silicon semiconductor portion 20 may be separated by an insulating film or the like. When the first electrode 50a and the second electrode 50b have been removed, the positive electrode 40a and the negative electrode 40b are provided before singulating the layered body 1A. The singulation may be performed at a position including the positive electrode 40a and the negative electrode 40b. The singulation step may be performed after the provision of the layered body 1A and before the step of diffusing the n-type impurity.

The method for manufacturing the sensor element 1 in the embodiment has been described above, but the embodiment is not limited only to this method. The method for manufacturing the sensor element 1 of the embodiment may include providing a layered body including a first silicon semiconductor portion including a first n-type impurity, a second silicon semiconductor portion provided on the first silicon semiconductor portion and including a second n-type impurity, and a third silicon semiconductor portion provided on the second silicon semiconductor portion and including a p-type impurity having an atomic number greater than an atomic number of silicon, and diffusing the p-type impurity by irradiating the layered body with light having a wavelength longer than a wavelength corresponding to a band gap of silicon while applying a forward current to the layered body. This makes it difficult to diffuse the p-type impurity in the step of diffusing the p-type impurity, thereby reducing the light emission of the sensor element itself. Examples of the p-type impurity include gallium and indium. Because the atomic number of gallium or indium is greater than that of silicon, gallium or indium is heavier than silicon and is less likely to diffuse. The sensor element can be manufactured by the method same as or similar to that described above except that the n-type impurity and the p-type impurity are replaced with each other.

Application Example 1: Radiation Thermometer

Figure 13:
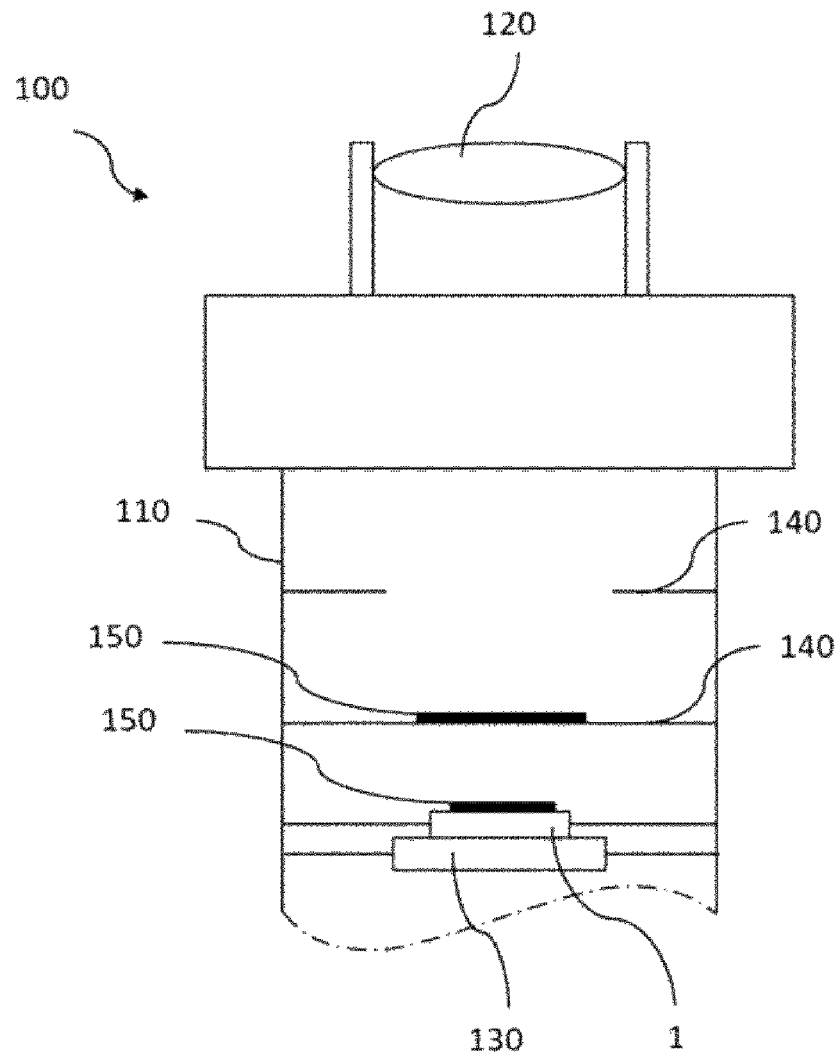
FIG. 13 is a schematic view illustrating a radiation thermometer including the sensor element of the embodiment.

FIG. 13 is a schematic view illustrating a radiation thermometer including the sensor element 1 of the embodiment. The radiation thermometer 100 includes a frame body 110, the sensor element 1, and a lens 120. The sensor element 1 is accommodated in the frame body 110. The sensor element 1 may be disposed on a submount 130. The lens 120 is disposed between the sensor element 1 and a measurement target. One or more diaphragms 140 are provided between the sensor element 1 and the lens 120. The sensor element 1 is a sensor element 1 according to the embodiment and has sensitivity at a wavelength longer than a wavelength corresponding to the band gap of silicon. The lens 120 condenses infrared rays or radiation emitted from the measurement target onto the sensor element 1. The radiation thermometer 100 may include a wavelength filter 150 between the sensor element 1 and the lens 120. The wavelength filter 150 transmits, for example, light having a wavelength in a range from 1110 nm to 4000 nm. Because the sensor element 1 can detect radiation of an object, it can be used as the radiation thermometer 100.

Application Example 2: Thermometer

Figure 14:
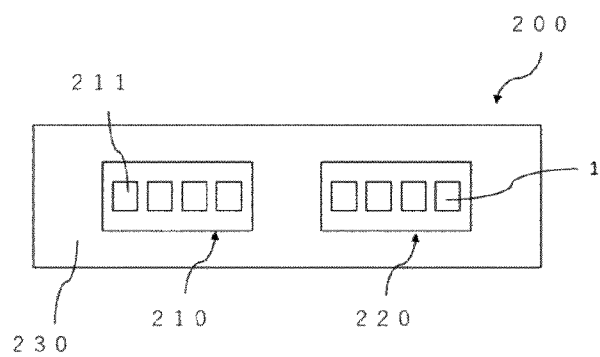
FIG. 14 is a schematic view illustrating a radiation thermometer equipped with the sensor elements according to the embodiment.

FIG. 14 is a schematic view illustrating a sensor 200. The sensor 200 includes a light-emitting element array 210 and a light-receiving element array 220, and the light-emitting element array 210 and the light-receiving element array 220 are disposed on a wiring substrate 230. The light-emitting element array 210 includes a plurality of light-emitting elements 211, and the plurality of light-emitting elements 211 are arranged at predetermined intervals. Each of the light-emitting elements emits light having a wavelength equal to or greater than 1300 nm. In the light-receiving element array 220, the sensor elements 1 of the embodiment are arranged at predetermined intervals. The light-receiving element array 220 receives light, which is emitted from the light-emitting element array 210 and reflected by the object. The sensor 200 can be attached to a human body such as a wrist or an ankle, for example. For example, a human body is irradiated with light from a light-emitting element array, and reflected light from hemoglobin or deoxyhemoglobin is measured by a light-receiving element array, whereby information such as the shape of a blood vessel can be obtained. Furthermore, the temperature of a portion to which the sensor 200 is attached may be measured.

Application Example 3: Image Sensor

Figure 15:
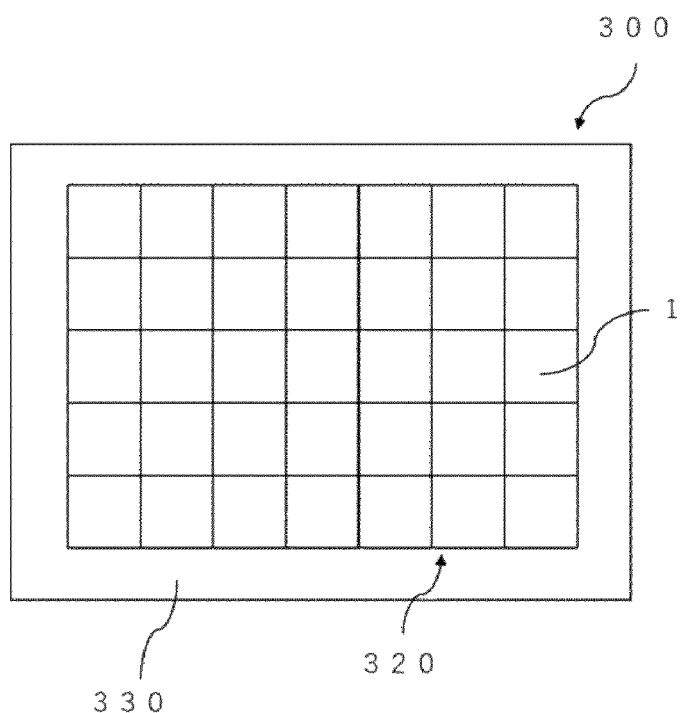
FIG. 15 is a schematic view illustrating an image sensor equipped with the sensor elements according to the embodiment.

FIG. 15 is a schematic top view illustrating an image sensor 300. The image sensor 300 includes a sensor element array 320 including the sensor element 1 according to the embodiment and a circuit board 330 electrically connected to the sensor element array 320. The sensor element 1 constitutes a pixel. Each pixel has sensitivity at a wavelength longer than a wavelength corresponding to the band gap of silicon. Because the intensity of light detected by each pixel is different depending on the incident position of light, the intensity distribution of light can be obtained. The sensor element array 320 may be formed by arranging a plurality of singulated sensor elements 1 in a matrix or may be formed by sectioning one sensor element 1 in a matrix so that the sensor element 1 defines a plurality of light-receiving regions arranged in the matrix.

EXAMPLES

The present disclosure will be described in detail below by using examples, but the present invention is not limited to these examples.

Example 1

First, a layered body 1A including a silicon substrate, which is the first silicon semiconductor portion 10, including a first p-type impurity, a silicon semiconductor layer, which is the second silicon semiconductor portion 20, including a second p-type impurity provided on the silicon substrate, and a silicon semiconductor layer, which is the third silicon semiconductor portion 30, including an n-type impurity provided on the second silicon semiconductor portion 20 was provided. The second silicon semiconductor portion 20 was a silicon semiconductor layer epitaxially grown by a CVD method. The third silicon semiconductor portion 30 was formed by implanting ions into the second silicon semiconductor portion 20. The first p-type impurity included in the first silicon semiconductor portion 10 was boron, and the first concentration was set so that the electrical resistivity of the first silicon semiconductor portion 10 was 0.1 Ωcm. The second p-type impurity included in the second silicon semiconductor portion 20 was boron, and the second concentration was set to $1 \times 10^{15}$ cm$^{-3}$. The electrical resistivity of the second silicon semiconductor portion 20 was 50 Ωcm. The n-type impurity included in the third silicon semiconductor portion 30 was arsenic, and the third concentration was set to $1 \times 10^{19}$ cm$^{-3}$. The electrical resistivity of the third silicon semiconductor portion 30 was 10 Ωcm before the DPP anneal. After providing the layered body 1A, singulation was performed. Subsequently, the DPP anneal was performed to obtain the sensor element 1. To be specific, while a forward current was caused to flow through the layered body 1A, the layered body 1A was irradiated with a laser beam having a wavelength of 1314 nm to diffuse the n-type impurity. The applied current was a steady current with a current density of 100 A/cm$^2$. The power of the laser beam was 100 mW. The DPP anneal was performed for 60 minutes.

Comparative Example 1

First, a layered body 1A including a silicon substrate including an n-type impurity, an n-type silicon semiconductor layer including an n-type impurity provided on the silicon substrate, and a p-type silicon semiconductor layer including a p-type impurity provided on the silicon semiconductor layer was provided. The n-type silicon semiconductor layer was epitaxially grown by a CVD method. The p-type silicon semiconductor layer was formed by implanting ions into the n-type silicon semiconductor. The n-type impurity included in the silicon substrate was arsenic, and the n-type impurity concentration was set so that the electrical resistivity was 0.1 Ωcm. The n-type impurity included in the n-type silicon semiconductor layer was arsenic, and the n-type impurity concentration was set to $1 \times 10^{19}$ cm$^{-3}$. The p-type impurity included in the p-type silicon semiconductor layer was boron, and the p-type impurity concentration was set to $1 \times 10^{19}$ cm$^{-3}$. Subsequently, the DPP anneal was performed. To be specific, while a forward current was caused to flow through the layered body 1A, the layered body 1A was irradiated with a laser beam having a wavelength of 1314 nm to diffuse the p-type impurity. The current density of the injected current was set to 100 A/cm$^2$. The power of the laser beam was 100 mW. The DPP anneal was performed for 60 minutes. After the DPP anneal, the layered body 1A was singulated to obtain a sensor element.

Evaluation

Current-Voltage Characteristics

Figure 16A:
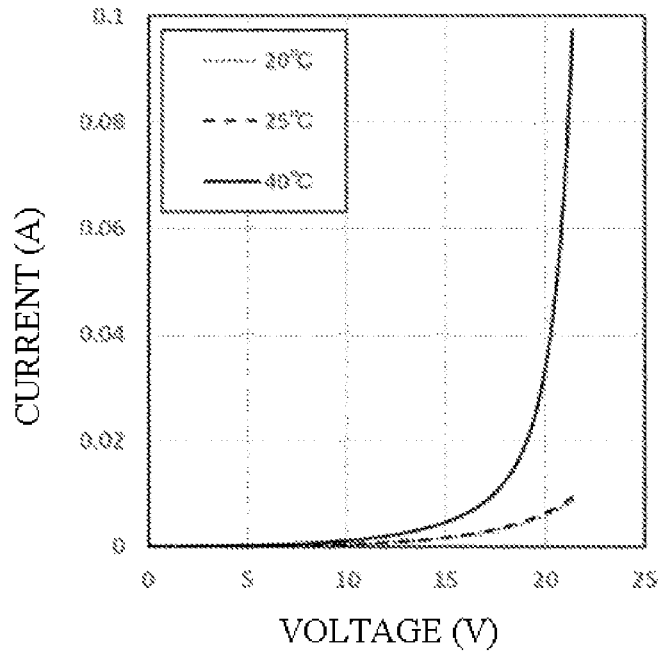
FIG. 16A is a graph illustrating current-voltage characteristics of a sensor element according to Example 1.

FIG. 16A is a graph illustrating the current-voltage characteristics of the sensor element 1 according to Example 1. The horizontal axis represents the voltage, and the vertical axis represents the current value. The sensor element 1 was disposed on a Peltier stage, and measurement was performed. A forward current was applied to drive the sensor element 1. FIG. 16A illustrates the measurement results when the temperature of the Peltier stage on which the sensor element 1 is disposed was set to 20° C., 25° C., and 40° C. under an environment of 23° C. In FIG. 16A, the dotted line, the broken line, and the solid line indicate the results at 20° C., 25° C., and 40° C., respectively. From this result, it was confirmed that the current-voltage characteristics of the sensor element 1 according to Example 1 exhibited a nonlinear temperature dependence.

Figure 16B:
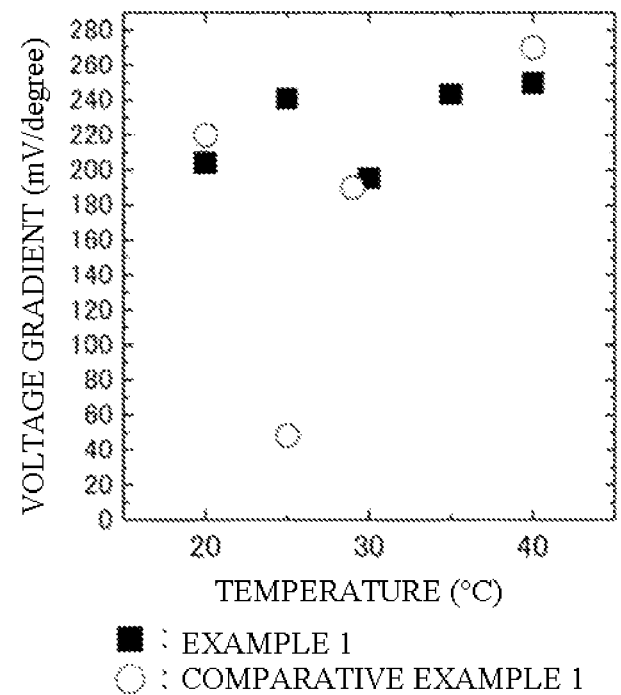
FIG. 16B is a graph illustrating a voltage gradient of sensor elements according to Example 1 and Comparative Example 1.

In FIG. 16B, the voltage gradient at the current value of 10 mA was obtained in the current-voltage characteristics when the temperature of the Peltier stage was set to 20° C., 25° C., 30° C., 35° C., and 40° C. as reference temperatures. The horizontal axis represents the temperature, and the vertical axis represents the voltage gradient. The voltage gradient at a temperature of 20° C. was obtained from the difference between a voltage value at the current value of 10 mA in the current-voltage characteristics when the temperature of the Peltier-stage was set to 20° C. and a voltage value at the current value of 10 mA in the current-voltage characteristics when the temperature of the Peltier-stage was set to 25° C. Similarly, the voltage gradient at a temperature of 25° C. was obtained from the current-voltage characteristics when the temperature of the Peltier stage was set to 25° C. and 30° C. The voltage gradient at a temperature of 30° C. was obtained from the current-voltage characteristics when the temperature of the Peltier stage was set to 30° C. and 35° C. The voltage gradient at a temperature of 35° C. was obtained from the current-voltage characteristics when the temperature of the Peltier stage was set to 35° C. and 40° C. The voltage gradient at a temperature of 40° C. was obtained from the current-voltage characteristics when the temperature of the Peltier stage was set to 40° C. and 45° C. The obtained voltage gradients were 150 mV/° C. or more at a temperature in a range from 20° C. to 40° C. The sensor element 1 was considered to have high sensitivity by absorbing radiation from the surroundings. In addition, because the light emission of the sensor element 1 was suppressed, the voltage gradients were considered to be maintained at a temperature in a range from 20° C. to 40° C. In the sensor element 1 of Example 1, the increase and decrease in the value of the voltage gradient is expected to reflect the behavior of the differential resistance value of the element.

The similar measurement was performed on the sensor element according to Comparative Example 1. For reference temperatures, the temperature of the Peltier stage was set to 20° C., 25° C., 29° C., and 40° C. The obtained voltage gradients were basically 150 mV/° C. or more at a temperature in the range from 20° C. to 40° C. However, the voltage gradient at a temperature of 25° C. exhibited a sharp voltage gradient drop of approximately 50 mV/° C. This is presumably because the sensor element in Comparative Example 1 had a relatively high light emission efficiency in the vicinity of a temperature of 25° C., and thus the sensor element was affected by noise due to the light emission of the sensor element itself. Such a drop in the voltage gradient was expected to occur in the vicinity of a temperature of 25° C. in the sensor element of Comparative Example 1. It was confirmed that the sensor element 1 of Example 1 did not exhibit a sharp voltage gradient drop at a temperature of 25° C. and operated stably in a wider temperature range. It was expected that this was because the sensor element 1 in Example 1 was suppressed in light emission as compared with the sensor element in Comparative Example 1, and thus noise due to light emitted by the sensor element 1 itself was reduced.

The invention claimed is:

1. A sensor element comprising:
   a first silicon semiconductor portion including a first p-type impurity;
   a second silicon semiconductor portion arranged on the first silicon semiconductor portion and including a second p-type impurity;
   a third silicon semiconductor portion arranged on the second silicon semiconductor portion and including an n-type impurity;
   a p-n junction defined between the second silicon semiconductor portion and the third silicon semiconductor portion, wherein
   the sensor element has light-receiving sensitivity to light having a wavelength longer than a wavelength corresponding to a band gap of silicon.

2. The sensor element according to claim 1, wherein
   a concentration of the second p-type impurity in the second silicon semiconductor portion is lower than a concentration of the first p-type impurity in the first silicon semiconductor portion.

3. The sensor element according to claim 1, wherein
   an electrical resistivity of a portion of the sensor element made of the first silicon semiconductor portion, the second silicon semiconductor portion, and the third silicon semiconductor portion is in a range from 1 Ωcm to 1000 MΩcm at a temperature of 25° C. and an applied voltage in a range from 1 V to 100 V.

4. The sensor element according to claim 1, wherein
   an amount of change in a voltage value per degree is in a range from 150 mV/° C. to 300 mV/° C. at a temperature in a range from 20° C. to 45° C. and a current value of 10 mA.

5. The sensor element according to claim 2, wherein
   an amount of change in a voltage value per degree is in a range from 150 mV/° C. to 300 mV/° C. at a temperature in a range from 20° C. to 45° C. and a current value of 10 mA.

6. The sensor element according to claim 3, wherein
   an amount of change in a voltage value per degree is in a range from 150 mV/° C. to 300 mV/° C. at a temperature in a range from 20° C. to 45° C. and a current value of 10 mA.

7. The sensor element according to claim 1, wherein
   the first silicon semiconductor portion is a silicon substrate, and
   the second silicon semiconductor portion is a silicon semiconductor layer.

8. The sensor element according to claim 4, wherein
   the first silicon semiconductor portion is a silicon substrate, and
   the second silicon semiconductor portion is a silicon semiconductor layer.

9. The sensor element according to claim 5, wherein
   the first silicon semiconductor portion is a silicon substrate, and
   the second silicon semiconductor portion is a silicon semiconductor layer.

10. The sensor element according to claim 1, wherein
    the second p-type impurity is boron or aluminum.

11. The sensor element according to claim 1, wherein
    the n-type impurity is arsenic, antimony, or bismuth.

12. The sensor element according to claim 1, further comprising
    a plurality of light-receiving regions arranged in a matrix.

13. A radiation thermometer comprising
    the sensor element according to claim 1.

14. A sensor element comprising:
    a first silicon semiconductor portion including a first n-type impurity;

a second silicon semiconductor portion arranged on the first silicon semiconductor portion and including a second n-type impurity;

a third silicon semiconductor portion arranged on the second silicon semiconductor portion and including a p-type impurity;

a p-n junction defined between the second silicon semiconductor portion and the third silicon semiconductor portion, wherein an atomic number of the p-type impurity is greater than an atomic number of silicon, and the sensor element has light-receiving sensitivity to light having a wavelength longer than a wavelength corresponding to a band gap of silicon.

15. A method for manufacturing a sensor element, the method comprising:

providing a layered body including
- a first silicon semiconductor portion including a first p-type impurity;
- a second silicon semiconductor portion arranged on the first silicon semiconductor portion and including a second p-type impurity; and
- a third silicon semiconductor portion arranged on the second silicon semiconductor portion and including an n-type impurity; and diffusing the n-type impurity by irradiating the layered body with light having a wavelength longer than a wavelength corresponding to a band gap of silicon while applying a forward current to the layered body.

16. A method for manufacturing a sensor element, the method comprising:

providing a layered body including
- a first silicon semiconductor portion comprising a first n-type impurity;
- a second silicon semiconductor portion provided on the first silicon semiconductor portion and comprising a second n-type impurity; and
- a third silicon semiconductor portion provided on the second silicon semiconductor portion and comprising a p-type impurity having an atomic number greater than an atomic number of silicon; and diffusing the p-type impurity by irradiating the layered body with light having a wavelength longer than a wavelength corresponding to a band gap of silicon while applying a forward current to the layered body.

* * * * *